(12) United States Patent
Villard et al.

(10) Patent No.: US 8,408,749 B2
(45) Date of Patent: *Apr. 2, 2013

(54) THERMAL TRANSFER IN SOLID STATE LIGHT EMITTING APPARATUS AND METHODS OF MANUFACTURING

(75) Inventors: Russell George Villard, Apex, NC (US); Robert Edward Higley, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/071,632

(22) Filed: Mar. 25, 2011

(65) Prior Publication Data

US 2011/0170301 A1 Jul. 14, 2011

Related U.S. Application Data

(63) Continuation of application No. 11/674,696, filed on Feb. 14, 2007, now Pat. No. 7,922,360.

(51) Int. Cl.
*F21V 29/00* (2006.01)
(52) U.S. Cl. .................... 362/294; 362/373
(58) Field of Classification Search .......... 362/294, 362/373, 800; 438/122; 257/712, 713, 719, 257/722; 361/709, 711

See application file for complete search history.

(56) References Cited

U.S. PATENT DOCUMENTS

| | | | |
|---|---|---|---|
| 6,517,218 B2 | 2/2003 | Hochstein | |
| 6,799,864 B2 | 10/2004 | Bohler et al. | |
| 6,807,059 B1 * | 10/2004 | Dale | 361/703 |
| 6,871,993 B2 | 3/2005 | Hecht | |
| 6,966,674 B2 * | 11/2005 | Tsai | 362/294 |
| 7,198,386 B2 | 4/2007 | Zampini et al. | |
| 7,218,041 B2 * | 5/2007 | Isoda | 313/11 |
| 7,234,844 B2 | 6/2007 | Bolta et al. | |
| 7,237,936 B1 | 7/2007 | Gibson | |
| 7,331,691 B2 | 2/2008 | Livesay et al. | |
| 7,347,589 B2 | 3/2008 | Ge | |
| 7,488,096 B2 | 2/2009 | Childers et al. | |
| 7,491,000 B2 * | 2/2009 | Takehashi et al. | 385/92 |
| 7,521,789 B1 * | 4/2009 | Rinehart et al. | 257/699 |
| 7,543,960 B2 | 6/2009 | Chang et al. | |
| 7,553,047 B2 | 6/2009 | Shin et al. | |
| 7,648,257 B2 | 1/2010 | Villard | |
| 7,712,926 B2 | 5/2010 | Matheson | |
| 7,784,969 B2 * | 8/2010 | Reisenauer et al. | 362/294 |
| 7,821,123 B2 * | 10/2010 | Oman | 257/706 |
| 7,889,502 B1 * | 2/2011 | Reis et al. | 361/717 |
| 7,976,335 B2 * | 7/2011 | Weber et al. | 439/487 |
| 7,997,766 B2 * | 8/2011 | Chen | 362/294 |
| 8,106,569 B2 * | 1/2012 | Gershaw | 313/46 |
| 2004/0052077 A1 | 3/2004 | Shih | |
| 2004/0079957 A1 | 4/2004 | Andrews et al. | |
| 2004/0126913 A1 | 7/2004 | Loh | |
| 2006/0131602 A1 * | 6/2006 | Ouderkirk et al. | 257/100 |
| 2007/0201232 A1 | 8/2007 | Chen | |
| 2007/0279909 A1 | 12/2007 | Li | |
| 2007/0297178 A1 | 12/2007 | Tain et al. | |
| 2008/0094841 A1 | 4/2008 | Dahm | |
| 2008/0123340 A1 | 5/2008 | McClellan | |
| 2008/0144318 A1 | 6/2008 | Kuan | |
| 2009/0135604 A1 | 5/2009 | Chen | |

* cited by examiner

*Primary Examiner* — Peggy A. Neils

(74) *Attorney, Agent, or Firm* — Myers Bigel Sibley & Sajovec

(57) ABSTRACT

Provided are light emitting apparatus including a solid state light emitting element having a first side and a second side, the solid state light emitting element configured to emit light from the first side. Such apparatus further include an elongated thermally conductive element positioned to conduct thermal energy from the second side of the solid state light emitting element.

17 Claims, 6 Drawing Sheets

THERMAL TRANSFER IN SOLID STATE LIGHT EMITTING APPARATUS AND METHODS OF MANUFACTURING

CROSS-REFERENCE TO RELATED APPLICATION

This application is a continuation of U.S. application Ser. No. 11/674,696, filed Feb. 14, 2007, now U.S. Pat No. 7,922,360, entitled Thermal Transfer in Solid State Light Emitting Apparatus and Methods of Manufacturing Same, the disclosure of which is hereby incorporated herein by reference in its entirety as if set forth fully herein.

FIELD OF THE INVENTION

This invention relates to solid state light emitting apparatus, and more particularly to packaging techniques and methods for solid state light emitting apparatus.

BACKGROUND OF THE INVENTION

Solid state light emitting apparatus are being widely designed and marketed as replacements for conventional incandescent lighting apparatus and/or other conventional lighting applications. Solid state light emitting apparatus can include solid state flashlights, spotlights, searchlights, headlights, pixels for arena displays, recessed lighting, light fixtures and/or other solid state lighting devices. Such solid state light emitting apparatus may generally include a mounting substrate and a plurality of solid state light emitting elements, such as Light Emitting Diodes (LEDs), on the mounting substrate. A housing may be configured for mounting the substrate therein. Optical elements, such as lenses, solid state light emitting element drivers and/or other support circuitry and/or a power source, such as a battery power supply and/or connections for an alternating current (AC)/direct current (DC) power supply, also may be provided. The solid state light emitting elements themselves may provide the appearance of white light, colored light and/or any other narrow or wideband light spectrum.

Although solid state light emitting elements, such as LEDs, may be more efficient than conventional incandescent light bulbs, the LEDs may still generate substantial heat under operating conditions, which may degrade device performance and/or reliability. Accordingly, when multiple LEDs are placed on a mounting substrate to provide a light emitting apparatus, thermal management techniques may be desired to dissipate heat and to maintain LED performance/reliability. Conventional techniques for thermal management may include mounting LEDs on thermally conductive media and/or the use of heat sinks. However, these techniques may not be as effective when LEDs are mounted in closely spaced configurations and/or enclosed spaces due to limited paths for the heat to escape.

SUMMARY OF THE INVENTION

Light emitting apparatus according to various embodiments of the present invention include a substrate having a first side and second side and multiple solid state light emitting elements mounted on the first side of the substrate. The apparatus further includes multiple elongated thermally conductive elements each having a proximal end attached proximate to the solid state lighting elements and a distal end attached to a housing, wherein the housing is configured to dissipate thermal energy that is conducted from the solid state light emitting elements via the elongated thermally conductive elements.

In some embodiments, the substrate further includes holes positioned proximate to the solid state light emitting elements, wherein the elongated thermally conductive elements are attached to the solid state light emitting elements and wherein the elongated thermally conductive elements are configured to traverse the holes and extend through the substrate and beyond the second side.

In some embodiments, each of the solid state lighting elements may include a mounting surface that includes a central region and is configured to be adjacent the first surface of the substrate and the mounting surface. The elongated thermally conductive elements are positioned opposite the central regions of the solid state light emitting elements.

Other embodiments of the invention provide methods of assembling a light emitting apparatus that include mounting a solid state light emitting element on a substrate by attaching the first side of the solid state light emitting element to a first side of the substrate, wherein the solid state light emitting element is configured to emit light from a second side. Some embodiments may include attaching a proximal end of an elongated thermally conductive element to a second side of the substrate corresponding to a central region of the solid state light emitting element, such that a portion of heat generated by the solid state light emitting element is transferred through the substrate to the proximal end of the elongated thermally conductive element.

In some embodiments, methods may include forming a recess on a first side of a substrate, mounting the proximal end of the elongated thermally conductive element on the substrate in the recess, and attaching the first side of the solid state light emitting element to a second side of the substrate proximate to the recess in the first side of the substrate.

In some embodiments, the elongated thermally conductive element may include multiple distal ends configured to dissipate thermal energy. In some embodiments, at least one of the distal ends is conductively coupled to a thermal dissipation structure.

Other embodiments of the invention provide methods of assembling a light emitting apparatus that include attaching a proximal end of an elongated thermally conductive element to a first side of the solid state light emitting element and attaching a distal end of the elongated thermally conductive element to a thermal energy dissipation element configured to dissipate thermal energy conducted from the solid state light emitting element via the elongated thermally conductive element and further configured to structurally support the solid state light emitting element via the elongated thermally conductive element.

Some embodiments may further include electrically coupling the proximal end of the elongated thermally conductive element to an electrical contact of the solid state light emitting element and electrically coupling the distal end of the elongated thermally conductive element to a driver contact that is electrically coupled to a solid state light emitting element driver. In some embodiments, the driver contact may include a neutral state signal level that is common with another solid state light emitting element.

Light emitting apparatus according to some embodiments of the present invention include a solid state light emitting element having a first side and a second side, the solid state light emitting element configured to emit light from the first side, a substrate having a first side configured to receive the second side of the solid state light emitting element, and an elongated thermally conductive element configured to extend beyond a second side of the substrate and having a proximal end positioned to conduct thermal energy from the second side of the solid state light emitting element.

In some embodiments, the second side of the solid state light emitting element is attached to the first side of the substrate and the proximal end of the elongated thermally conductive element is attached to the second side of the substrate substantially proximate to the solid state light emitting element.

In some embodiments, the second side of the substrate includes a recess substantially proximate to the solid state light emitting element, wherein the proximal end of the elongated thermally conductive element is attached to the substrate in the recess and wherein the distance between the proximal end of the elongated thermally conductive element and the solid state light emitting element is less than a thickness of the substrate.

In some embodiments, a light emitting apparatus includes a substrate having a hole through the substrate from the first side to the second side, wherein the second side of the solid state light emitting element is attached to the first side of the substrate proximate to the hole and wherein the proximal end of the elongated thermally conductive element is attached to the second side of the solid state light emitting element and the elongated thermally conductive element extends through the hole beyond the second side of the substrate.

In some embodiments, the elongated thermally conductive element includes a thermally conductive material that can include aluminum, copper and/or graphite.

In some embodiments, the elongated thermally conductive element includes a plurality of distal ends configured to conduct thermal energy from the proximal end.

Some embodiments further include a thermal dissipation component conductively coupled to a distal end of the elongated thermally conductive element. In some embodiments, the thermal dissipation component is a housing component in which the light emitting apparatus is mounted.

Some embodiments include means for electrically coupling the solid state light emitting element to a control circuit via the elongated thermally conductive element.

In some embodiments, the elongated thermally conductive element is attached to the solid state light emitting element and is configured to provide structural support to the solid state light emitting element.

Some embodiments may include a thermally conductive bonding agent configured to attach the elongated thermally conductive element to the solid state light emitting element.

DETAILED DESCRIPTION

Figure 1:
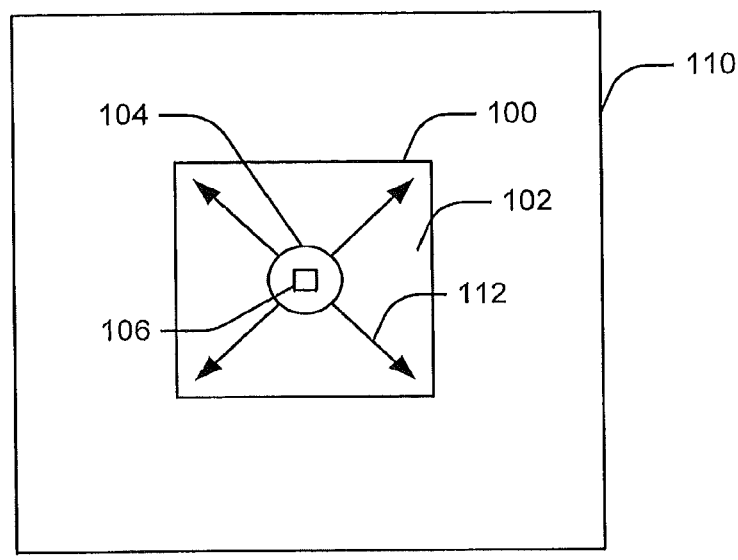
FIG. 1 is a top view of a solid state light emitting apparatus having one solid state light emitting element according to various embodiments of the invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "included," "including," "have" and/or "having" when used in this specification, specify the presence of stated features, regions, steps, operations, elements, and/or components, but do not preclude the presence or addition of one or more other features, regions, steps, operations, elements, components, and/or groups thereof.

It will be understood that when an element, such as a layer or region, is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may' be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is now made to FIG. 1, which is a top view of a solid state light emitting apparatus having one solid state light emitting element according to various embodiments of the invention. A solid state light emitting apparatus includes a solid state light emitting element 100 mounted on a substrate 110. In some embodiments, the substrate 110 may be, for example, a metal core printed circuit board (MCPCB) configured to structurally support and electrically interface with the solid state light emitting element 100. The solid state light emitting element 100 may include a submount 102 configured to support, for example, an emitter 106, a lens 104, and various electrical connectivity components such as conductive pads, traces and solder joints. The submount 102 may also be configured to dissipate conducted heat 112 from the emitter 106 to the surrounding environment and/or enclosure. The amount of conducted heat 112 that can be dissipated through the submount 102 is dependent on a variety of factors including, for example, ambient operating temperature and/or structural features proximate to the solid state light emitting element 100. Since the amount of heat generated by the emitter 106 is a function of the amount of current used to drive the emitter 106, a higher current application may require greater heat dissipation capacity. Further, although illustrated in the context of one solid state light emitting element 100, multiple solid state light emitting elements 100 may be mounted to the substrate 110 to increase the light output and/or regulate a color and/or hue of the emitted light.

Figure 2:
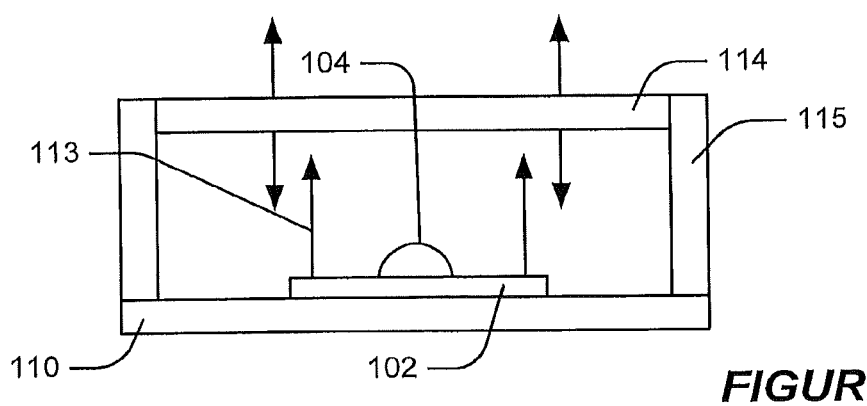
FIG. 2 is a partial, side cross-sectional view of a device using a solid state light emitting apparatus according to various embodiments of the invention.

Reference is now made to FIG. 2, which is a partial, side cross-sectional view of a device using a solid state light emitting apparatus according to various embodiments of the invention. A solid state light emitting element 100 is mounted on a substrate 110. The substrate 110 is attached to side walls 115, which may further support an upper transmission component 114. The upper transmission component 114 may include an optical component, such as a glass and/or plastic lens, and/or a display component, such as, for example, a Liquid Crystal Display (LCD) panel. Heat generated by the solid state light emitting element 100 may be dissipated from the submount 102, for example, in the form of radiant heat 113. In some embodiments, the radiant heat 113 is not fully transmitted by the upper transmission component 114 and remains in the cavity defined by the substrate 110 and the upper transmission component 114. In some embodiments, the emitted light output levels may be limited by the amount of heat that the upper transmission component 114 transmits.

Figure 3:
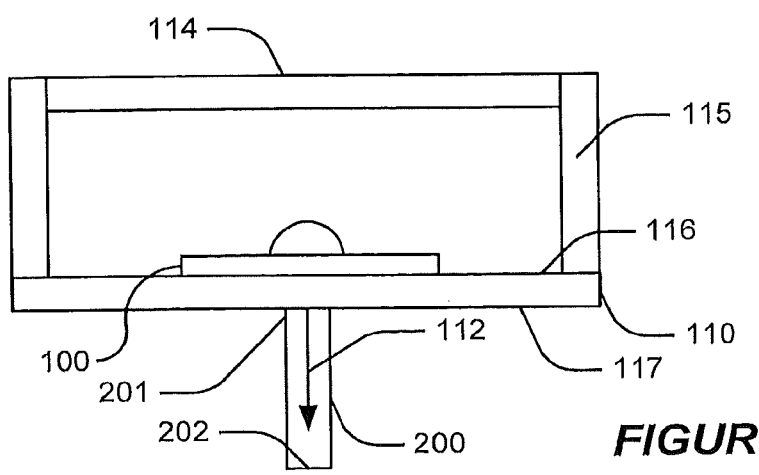
FIG. 3 is a partial, side cross-sectional view of a device using a solid state light emitting apparatus that transfers heat substantially opposite the direction of the emitted light according to various embodiments of the invention.

Reference is now made to FIG. 3, which is a partial, side cross-sectional view of a device using a solid state light emitting apparatus that transfers heat substantially opposite the direction of the emitted light according to various embodiments of the invention. The solid state light emitting element 100 is mounted on a first side 116 of a substrate 110. Side walls 115 may be attached to the first side 116 of the substrate 110 and configured to support an upper transmission component 114 that is proximate to the first side 116 of the substrate 110. An elongated thermally conductive element 200 having a proximal end 201 and a distal end 202 is attached to the substrate 110 by attaching the proximal end 201 to the second side 117 in a location that is proximate to the solid state light emitting element 100 on the first side 116. In this manner, the elongated thermally conductive element 200 can conductively transfer heat 112 from the solid state light emitting element 100 on the first side 116 to the second side 117 of the substrate 110.

Figure 4:
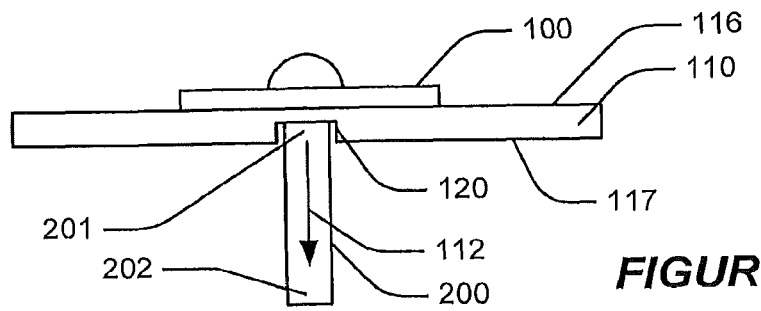
FIG. 4 is a partial, side cross-sectional view of a device using a solid state light emitting apparatus that transfers heat substantially opposite the direction of the emitted light according to various other embodiments of the invention.

Reference is now made to FIG. 4, which is a partial, side cross-sectional view of a device using a solid state light emitting apparatus that transfers heat substantially opposite the direction of the emitted light according to various other embodiments of the invention. A solid state light emitting element 100 is mounted to a first side 116 of a substrate 110. The substrate 110 includes a second side 117 having a recess 120 formed substantially proximate to a central region of the solid state light emitting element 100. The central region may be proximate to the emitter 106 (FIG. 1), which generates heat during normal operation. The recess 120 is configured to receive a proximal end 201 of an elongated thermally conductive element 200. By positioning the recess 120 proximate to the central region, transfer of heat via the elongated thermally conductive element 200 may be improved. In some embodiments, the distal end 200 of the elongated thermally conductive element 200 may be connected to another heat dissipation component, such as, for example, a heat sink. In some embodiments, the elongated thermally conductive element 200 may be configured to dissipate the heat without the use of an additional heat dissipation component.

Figure 14A:
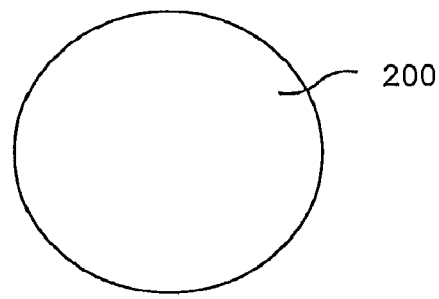
FIGS. 14A-14C are cross-sectional views of various embodiments of an elongated thermally conductive element according to some embodiments of the present invention.
Figure 14B:
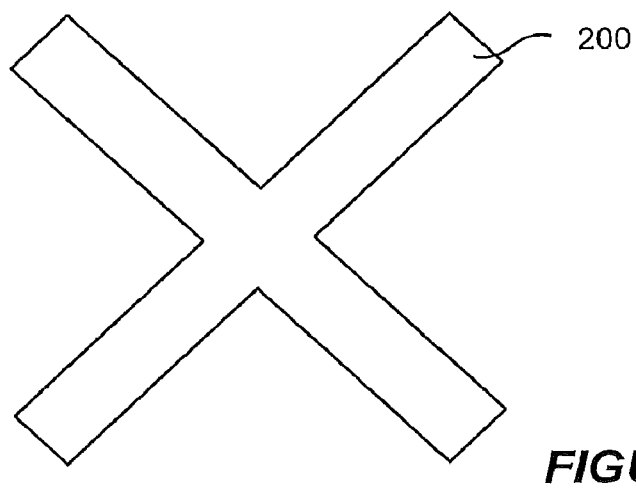
Figure 14C:
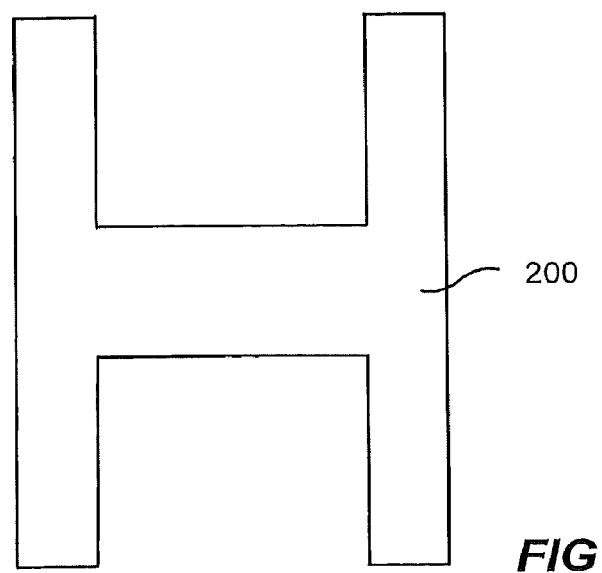

In some embodiments, the length, profile and/or cross-sectional area may be modified responsive to heat dissipation requirements. For example, the cross-sectional area may be increased to reduce constrictions in heat transfer. In some embodiments, the length of the elongated thermally conductive element 200 may be increased to fully dissipate conductively transferred heat. Some embodiments may utilize specific cross-sectional shape profiles to increase heat dissipation. For example, referring to FIGS. 14A, 14B and 14C, a thermal conductive element 200 may be configured to have a "O", "X", and/or "H" cross-sectional shape. In some embodiments, the elongated thermally conductive material may include a variety of thermally conductive materials including for example, aluminum, nickel, copper, graphite, and/or alloys thereof, for example.

Figure 5:
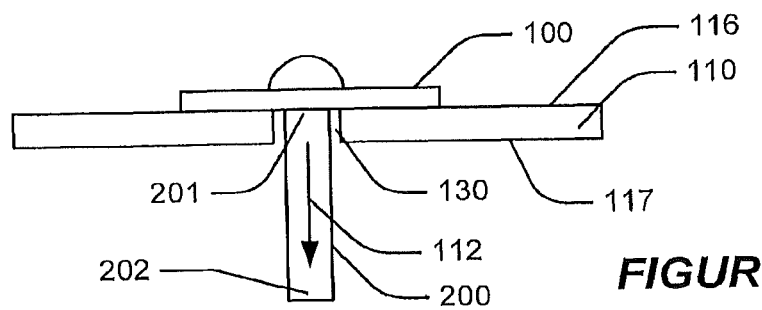
FIG. 5 is a partial, side cross-sectional view of a device using a solid state light emitting apparatus that transfers heat substantially opposite the direction of the emitted light according to various other embodiments of the invention.

Reference is now made to FIG. 5, which is a partial, side cross-sectional view of a device using a solid state light emitting apparatus that transfers heat substantially opposite the direction of the emitted light according to various other embodiments of the invention. A solid state light emitting element 100 is mounted to a first side 116 of a substrate 110. The substrate 110 includes a second side 117 and a hole 120 between the first side 116 and the second side 117 that may be formed substantially proximate to a central region of the solid state light emitting element 100. The hole 130 is configured to receive an elongated thermally conductive element 200 that may be attached to the solid state light emitting element 100 proximate to the central region. In this manner, the elongated thermally conductive element 200 may conductively transfer heat directly from the solid state light emitting element 100 beyond the second side 117 of the substrate 110.

Figure 6:
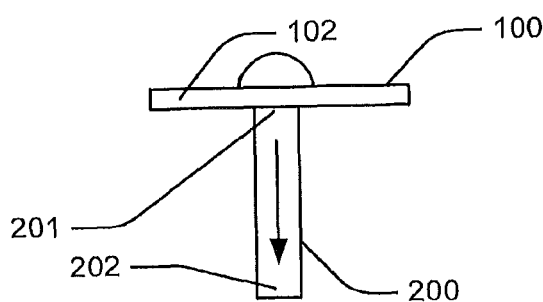
FIG. 6 is a partial, side cross-sectional view of a solid state light emitting apparatus that transfers heat substantially opposite the direction of the emitted light according to various embodiments of the invention.

Reference is now made to FIG. 6, which is a partial, side cross-sectional view of a solid state light emitting apparatus that transfers heat substantially opposite the direction of the emitted light according to various embodiments of the invention. A solid state light emitting element 100 configured to emit light from a first side of the submount 102 is attached to an elongated thermally conductive element 200 on a second side of the submount 102. The elongated thermally conductive element 200 includes a proximal end 201 attached to the submount 102 and configured to conductively transfer heat from the solid state light emitting element 100. In some embodiments, the elongated thermally conductive element 200 is attached to another structure and may provide structural support for the solid state light emitting element 100.

Figure 7:
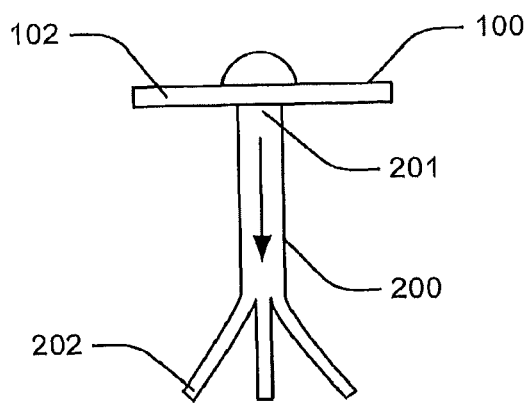
FIG. 7 is a partial, side cross-sectional view of a solid state light emitting apparatus that transfers heat substantially opposite the direction of the emitted light according to various other embodiments of the invention.

Reference is now made to FIG. 7, which is a partial, side cross-sectional view of a solid state light emitting apparatus that transfers heat substantially opposite the direction of the emitted light according to various other embodiments of the invention. A solid state light emitting element 100 configured to emit light from a first side of the submount 102 is attached to an elongated thermally conductive element 200 on a second side of the submount 102. The elongated thermally conductive element 200 includes a proximal end 201 attached to the submount 102 and a multiple distal ends 202 that may be configured to improve heat dissipation via the elongated thermally conductive element 200. For example, by increasing the number of distal ends 202, the surface area exposed for transferring heat to the surrounding atmosphere may be increased. In this manner, for example, the overall length of the elongated thermally conductive element 200 may be reduced for a given heat load.

Figure 8:
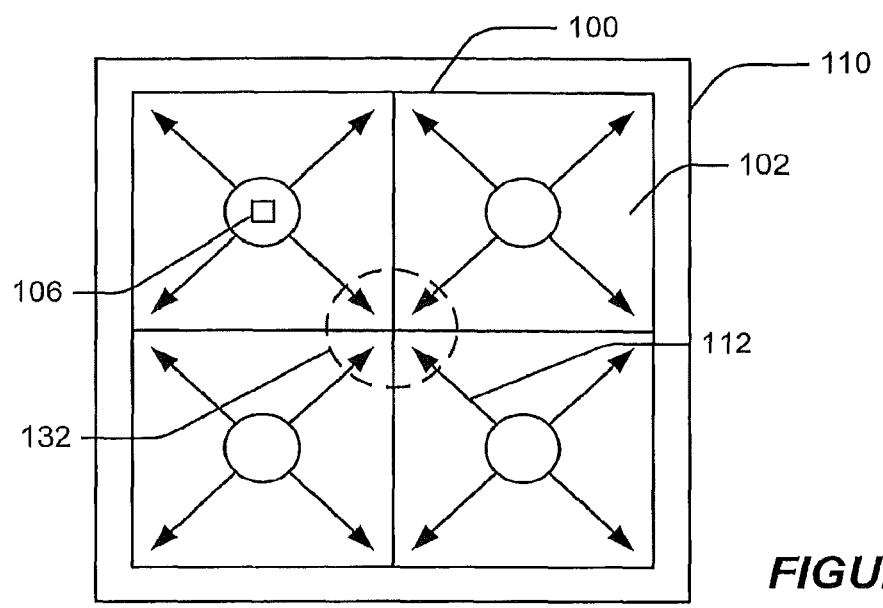
FIG. 8 is a top view of a solid state light emitting apparatus having multiple solid state light emitting elements according to various embodiments of the invention.

Brief reference is now made to FIG. 8, which is a top view of a solid state light emitting apparatus having multiple solid state light emitting elements according to various embodiments of the invention. Multiple solid state light emitting elements 100 are adjacently disposed on a substrate 110. The solid state light emitting elements 100 generate heat 112 that may be transferred and radiated away from the emitters 106 via submounts 102. Dissipating the heat 112, however, may be more problematic in areas 132 between solid state light emitting elements 100 and may result in an undesirable accumulation of thermal energy in these regions.

Figure 9:
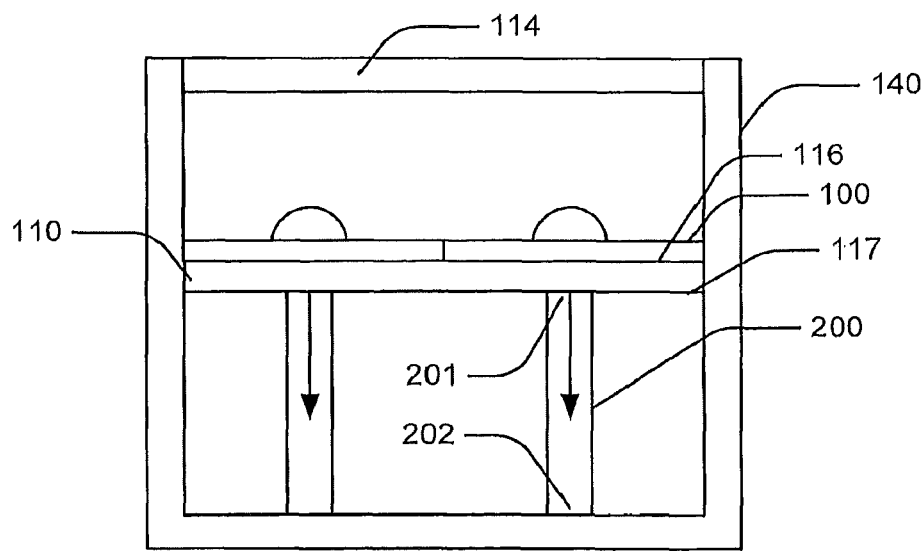
FIG. 9 is a partial, side cross-sectional view of a device using a solid state light emitting apparatus having multiple solid state light emitting elements according to various embodiments of the invention.

Reference is now made to FIG. 9, which is a partial, side cross-sectional view of a device using a solid state light emitting apparatus having multiple solid state light emitting elements according to various embodiments of the invention. Multiple solid state light emitting elements 100 are mounted on a first side 116 of a substrate 110. The substrate 110 is mounted within a housing 140. The housing 140 may include a variety of materials and configurations that may depend on the type of apparatus. For example, the housing may be a configured for a light supplying device such as, for example, a flashlight and/or other type of lighting fixture. In some embodiments, the housing is for an electronics device that performs an additional function other than illumination. For example, a display device, such as a television, monitor or other instrument may include such a housing. Examples of such devices may include handheld portable devices, such as mobile telephones, PDA's etc. In some embodiments, such devices may include an upper transmission component 114, such as a display, for example.

Thermally conductive elements 200 each include a proximal end 201 attached to a second side 117 of the substrate 110 proximate to a central region of the solid state light emitting elements 100. The elongated thermally conductive elements 200 each include a distal end 202 attached to the housing 140. In this manner, heat may be conducted from the solid state light emitting element 100 to the housing 140 for dissipation to the atmosphere external to the housing 140. In some embodiments, the second side 117 of the substrate 110 may include recesses configured to receive the proximal ends 201 of the elongated thermally conductive elements 200. In some embodiments, the substrate 110 includes holes for receiving thermally conductive elements 200 that are attached to the solid state light emitting elements 100.

Figure 10:
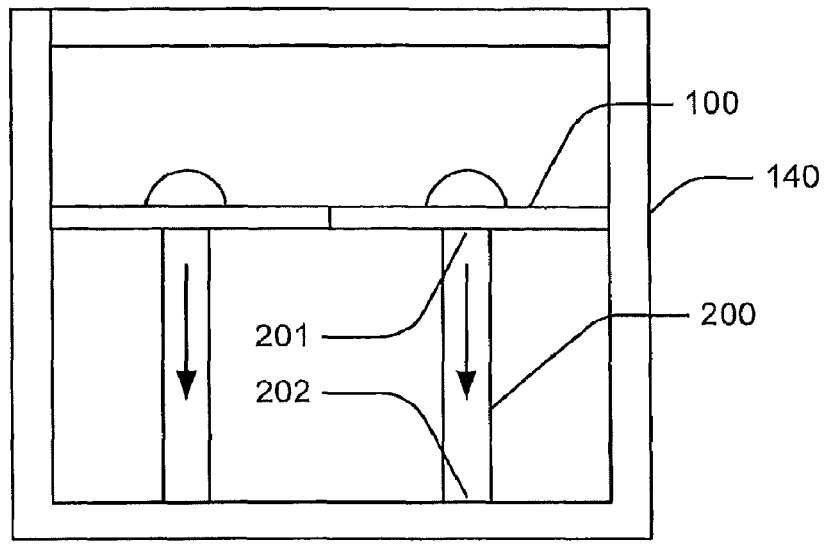
FIG. 10 is a partial, side cross-sectional view of a device using a solid state light emitting apparatus having multiple solid state light emitting elements according to various other embodiments of the invention.

Reference is now made to FIG. 10, which is a partial, side cross-sectional view of a device using a solid state light emitting apparatus having multiple solid state light emitting elements according to various other embodiments of the invention. Multiple solid state light emitting elements 100 are mounted within a housing 140. Thermally conductive elements 200 include proximal ends 201 that are attached to the solid state light emitting elements 100 and distal ends 202 that are attached to the housing 140. In this manner, the housing 140 may be utilized to dissipate heat that is conductively transferred from the solid state light emitting elements 100 via the elongated thermally conductive elements 200. The elongated thermally conductive elements 200 may also provide structural support for the solid state light emitting elements 100 such that a substrate may be unnecessary.

Figure 11:
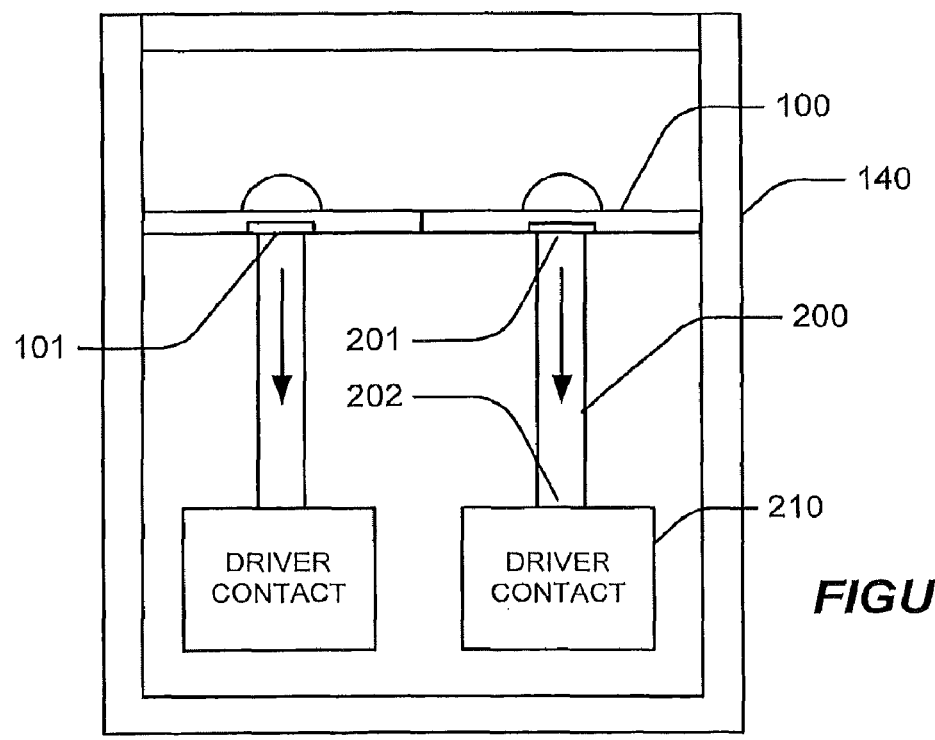
FIG. 11 is a partial, side cross-sectional view of a device using a solid state light emitting apparatus having multiple solid state light emitting elements according to various other embodiments of the invention.

Reference is now made to FIG. 11, which is a partial, side cross-sectional view of a device using a solid state light emitting apparatus having multiple solid state light emitting elements according to various other embodiments of the invention. Multiple solid state light emitting elements 100 are mounted within a housing 140. Thermally conductive elements 200 include proximal ends 201 that are attached to electrical contacts 101 of the solid state light emitting elements 100 and distal ends 202 that are attached to driver contacts 210. The elongated thermally conductive elements 200 are configured to conduct heat from the solid state light emitting elements 100 and to conduct electrical current between the driver contacts 210 and the electrical contacts 101 of the solid state light emitting element 100. In some embodiments, the solid state light emitting elements 100 may be structurally supported by the elongated thermally conductive elements 200. The driver contact 210 may be remotely located from the driver and/or adjacent/proximate to the driver.

Figure 12:
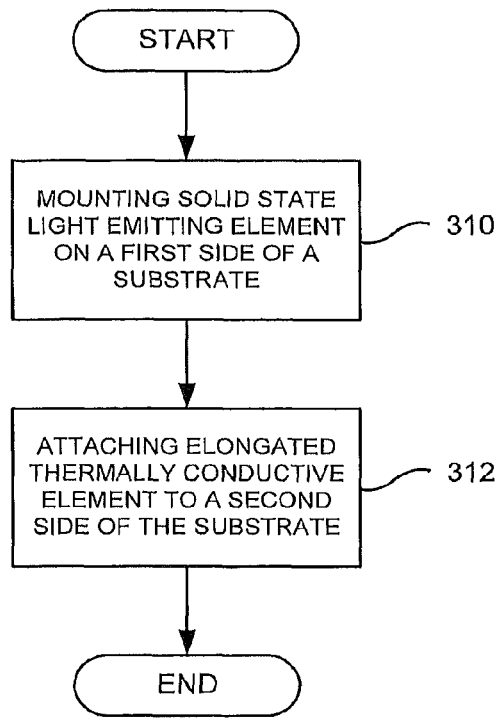
FIG. 12 is a block diagram illustrating operations for assembling a solid state light emitting apparatus according to various embodiments of the invention.

Reference is now made to FIG. 12, which is a block diagram illustrating operations for assembling a solid state light emitting apparatus according to various embodiments of the invention. Operations include mounting a solid state light emitting element on a first side of a substrate (block 310). An elongated thermally conductive element is attached to a second side of the substrate (block 312). In some embodiments, the elongated thermally conductive element may be positioned proximate to a first side of the solid state light emitting element wherein the solid state light emitting element may be configured to emit light from a second side of the solid state light emitting element. In this manner, heat may be transferred in a direction substantially different from the direction of the emitted light. In some embodiments, the elongated thermally conductive element is attached to a second side of the substrate corresponding to a central region of the solid state light emitting element. The central region may correspond, for example, to a heat generating component in the solid state light emitting element. In some embodiments, the heat generating component of the solid state light emitting device may not be located in a central region, in which case the elongated thermally conductive element may be attached corresponding to a non-central region of the solid state light emitting element.

In some embodiments, a recess may be formed in the second side of the substrate proximate to the solid state light emitting element. A proximal end of the elongated thermally conductive element may be mounted in the recess such that the distance between the proximal end and the solid state light emitting element is less than the thickness of the substrate.

Figure 13:
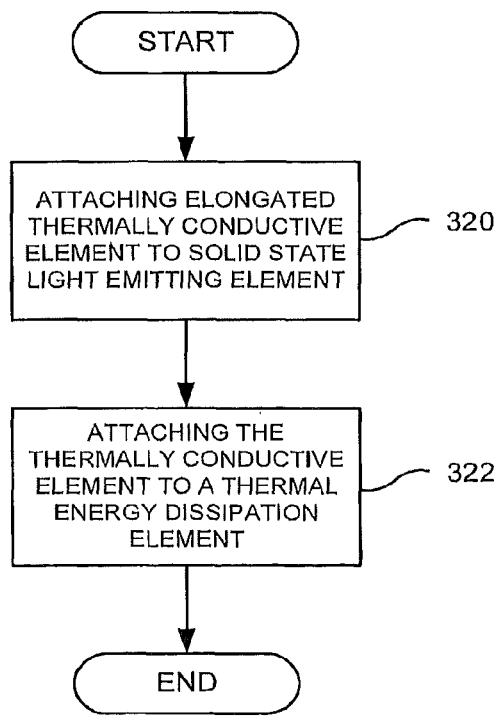
FIG. 13 is a block diagram illustrating operations for assembling a solid state light emitting apparatus according to various other embodiments of the invention.

Reference is now made to FIG. 13, which is a block diagram illustrating operations for assembling a solid state light emitting apparatus according to various other embodiments of the invention. Operations include attaching an elongated thermally conductive element proximate to a solid state light emitting element (block 320). The elongated thermally conductive element may be attached using, for example, solder, a mechanical fastener, and/or a chemical bonding agent, such as thermal epoxy. The elongated thermally conductive element is attached to a thermal energy dissipation element (block 322). In some embodiments, a thermal dissipation element may include, for example, a housing, chassis, and/or heat sink and may be configured to support the solid state light emitting elements via the elongated thermally conductive elements. In some embodiments, the support structure may function to dissipate heat transferred from the solid state light emitting elements via the elongated thermally conductive elements. In some embodiments, the elongated thermally conductive element may be attached to a driver contact that is electrically coupled to a solid state light emitting element driver. In this manner, the elongated thermally conductive element may function as an electrical conductor for driving the solid state light emitting element. For example, in some embodiments multiple thermally conductive elements may be connected to one or more structural components that are at an electrically neutral signal level.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting apparatus mounted in a housing, comprising:
    a plurality of solid state light emitting elements including a first side that is configured to emit light and a second side that is opposite the first side; and
    a plurality of columnar thermally conductive elements that each have a proximal end that is proximate the second side of the plurality of solid state lighting elements and a distal end that is configured to conductively engage the housing in which the light emitting apparatus is mounted via contact between the distal end and the housing, wherein the housing is configured to dissipate thermal energy that is conducted from the plurality of solid state light emitting elements via the plurality of thermally conductive elements.

2. The light emitting apparatus according to claim 1, wherein the plurality of columnar thermally conductive elements are attached to the plurality of solid state light emitting elements.

3. The light emitting apparatus according to claim 1,
    wherein the each of the plurality of solid state lighting elements comprises a mounting surface that includes a central region,
    and wherein the plurality of elongated thermally conductive elements are positioned proximate the central regions of the mounting surfaces of the plurality of solid state light emitting elements.

4. The light emitting apparatus according to claim 1, wherein the respective ones of the plurality of columnar thermally conductive elements comprise a plurality of distal ends that are configured to conduct thermal energy from the proximal ends.

5. The light emitting apparatus according to claim 4, wherein at least one of the plurality of distal ends is conductively coupled to the housing.

6. A method of assembling a light emitting apparatus comprising:
    attaching a proximal end of an elongated thermally conductive element to a first side of a solid state light emitting element configured to emit light from a second side;
    attaching a distal end of the elongated thermally conductive element to a thermal energy dissipation element configured to dissipate thermal energy conducted from the solid state light emitting element via the elongated thermally conductive element and further configured to structurally support the solid state light emitting element via the elongated thermally conductive element; and
    electrically coupling the proximal end of the elongated thermally conductive element to an electrical contact of the solid state light emitting element and electrically coupling the distal end of the elongated thermally conductive element to a driver contact that is electrically coupled to a solid state light emitting element driver.

7. The method according to claim 6, wherein the driver contact comprises a neutral state signal level contact that is common with another solid state light emitting element.

8. The method according to claim 6, wherein the elongated thermally conductive element includes an "O" cross-sectional shape.

9. The method according to claim 6, wherein the elongated thermally conductive element includes an "X" cross-sectional shape.

10. The method according to claim 6, wherein the elongated thermally conductive element includes an "H" cross-sectional shape.

11. A light emitting apparatus, comprising:
a solid state light emitting element having a first side and a second side that is opposite the first side, the solid state light emitting element configured to emit light from the first side;
an elongated thermally conductive element that includes a proximal end positioned to conduct thermal energy from the second side of the solid state light emitting element;
a thermal dissipation component including a housing component in which the light emitting apparatus is mounted and that is conductively coupled to a distal end of the elongated thermally conductive element; and
means for electrically coupling the solid state light emitting element to a control circuit via the elongated thermally conductive element.

12. The light emitting apparatus according to claim 11, wherein the elongated thermally conductive element comprises a thermally conductive material selected from the group consisting of: aluminum, copper and graphite.

13. The light emitting apparatus according to claim 11, wherein the elongated thermally conductive element comprises a plurality of distal ends configured to conduct thermal energy from the proximal end.

14. The light emitting apparatus according to claim 11, wherein the elongated thermally conductive element is attached to the solid state light emitting element and is configured to provide structural support to the solid state light emitting element.

15. The light emitting apparatus according to claim 14, further comprising a thermally conductive bonding agent configured to attach the elongated thermally conductive element to the solid state light emitting element.

16. A light emitting apparatus mounted in a housing, comprising:
a plurality of solid state light emitting elements including a first side that is configured to emit light and a second side that is opposite the first side; and
a plurality of non-hollow thermally conductive rods extending from second sides of respective ones of the plurality of solid state light emitting elements, each of the plurality of non-hollow thermally conductive rods having a proximal end that is proximate a corresponding one of the plurality of solid state lighting elements,
wherein each of the plurality of non-hollow thermally conductive rods comprises a plurality of distal ends that are configured to dissipate heat from the plurality of solid state light emitting elements.

17. A light emitting apparatus mounted in a housing, comprising:
a substrate having a first side and second side;
a plurality of solid state light emitting elements mounted on the first side of the substrate;
a plurality of elongated thermally conductive elements that extend from the second side of the substrate, each of the plurality of elongated thermally conductive elements having a proximal end that is proximate a corresponding one of the plurality of solid state lighting elements,
wherein respective ones of the plurality of elongated thermally conductive elements comprise a plurality of distal ends that are configured to conduct thermal energy from the proximal ends.

* * * * *